Figure 1:
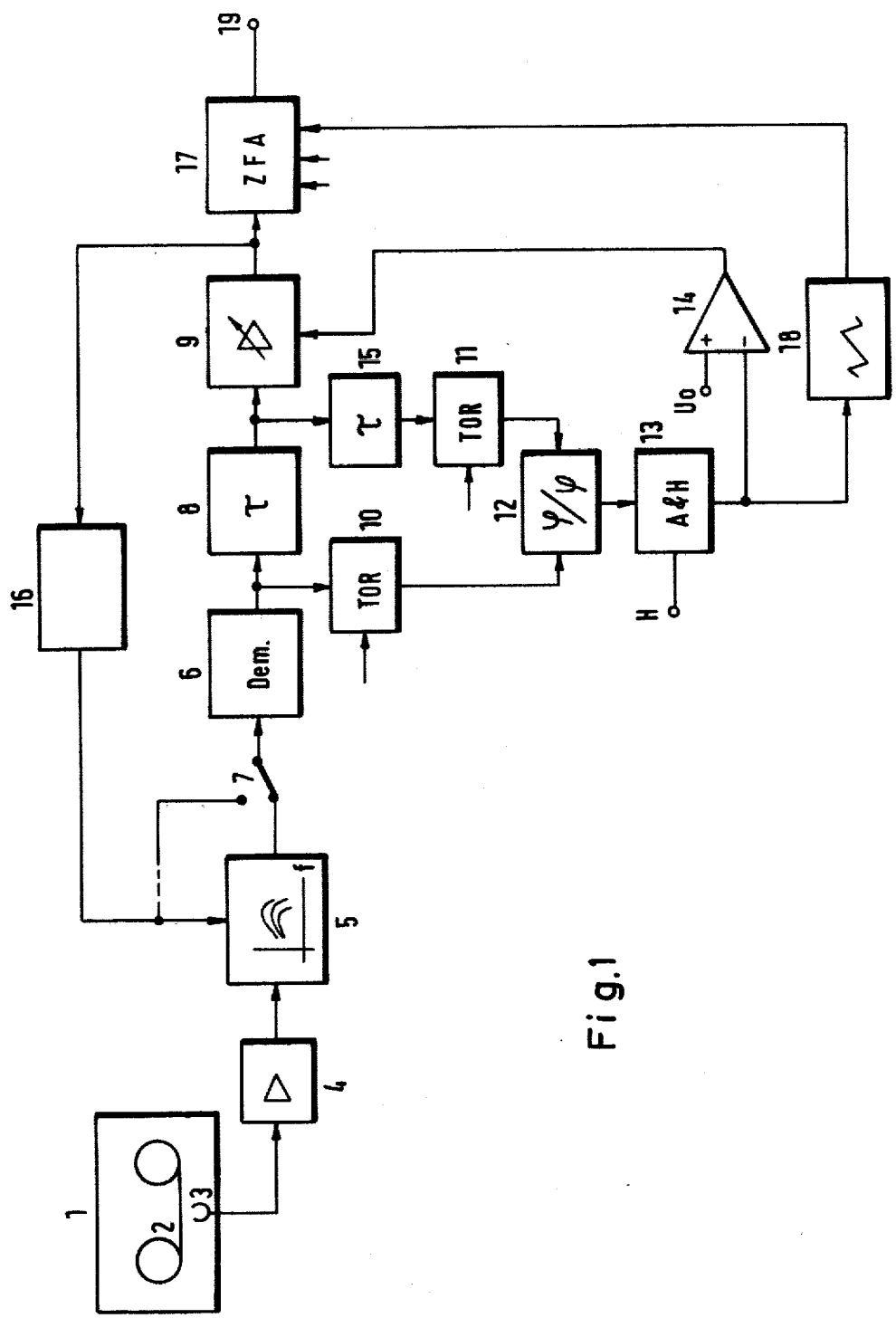

United States Patent [19]

Sochor et al.

[11] 4,300,172
[45] Nov. 10, 1981

[54] PLAYBACK SYSTEM WITH AMPLITUDE CORRECTION FOR FREQUENCY MODULATED SIGNALS

[75] Inventors: Josef Sochor, Darmstadt; Winfried Horstmann, Griesheim; Hubert Foerster, Darmstadt-Eberstadt, all of Fed. Rep. of Germany

[73] Assignee: Robert Bosch GmbH, Stuttgart, Fed. Rep. of Germany

[21] Appl. No.: 20,730

[22] Filed: Mar. 15, 1979

[30] Foreign Application Priority Data

Mar. 25, 1978 [DE] Fed. Rep. of Germany ....... 2813207

[51] Int. Cl.³ .................... H04N 5/79; H04N 5/795
[52] U.S. Cl. ........................................ 360/33; 358/8
[58] Field of Search ............... 360/33, 36; 358/8, 19, 358/21, 174, 176

[56] References Cited

U.S. PATENT DOCUMENTS 3,501,585  3/1970  DeLange .......................... 360/33
3,715,462  2/1973  Krause ............................. 358/8
4,065,787  12/1977  Owen et al. ..................... 360/36
4,165,495  8/1979  Takahashi et al. ............. 358/8 X Primary Examiner—Aristotelis M. Psitos
Attorney, Agent, or Firm—Frishauf, Holtz, Goodman & Woodward

[57] ABSTRACT

Since frequency modulated signals such as color television signals are subject to amplitude changes as well as timing changes if the playback speed is not the same as the recording speed, a variable gain amplifier is provided. The gain of the variable gain amplifier is controlled by an error signal which corresponds to a measured difference between the recording and playback speed. The measured difference is derived from a phase comparison of separated color bursts and of the same bursts delayed by one line period. The amplitude corrected signals at the output of the variable gain amplifier are also applied to an amplitude measuring stage 16 whose output in turn controls the frequency characteristic of a filter filtering the color television signals prior to demodulation.

3 Claims, 2 Drawing Figures

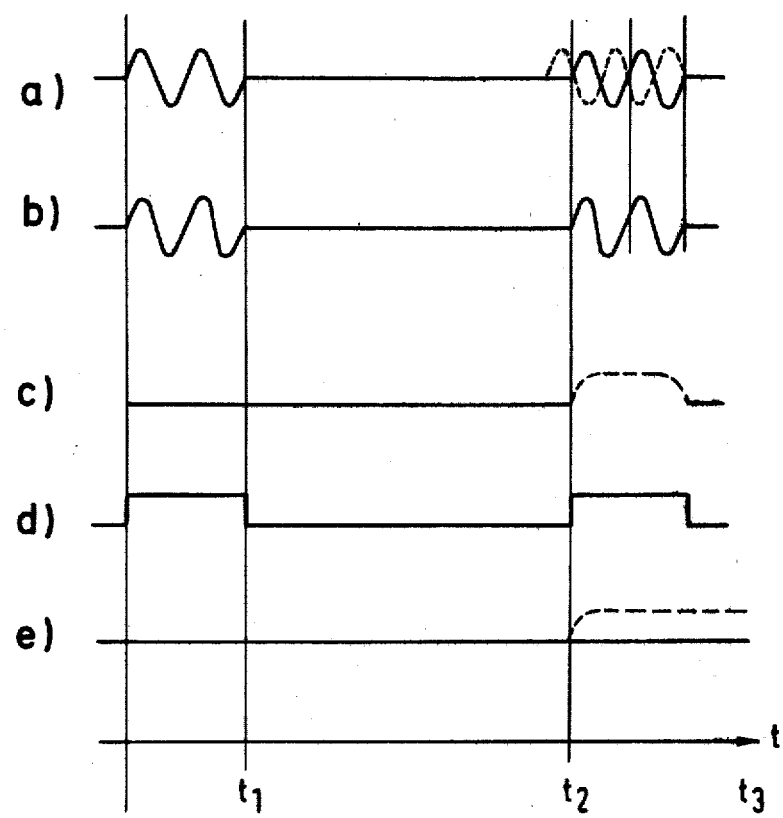

PLAYBACK SYSTEM WITH AMPLITUDE CORRECTION FOR FREQUENCY MODULATED SIGNALS

Cross-reference to related applications and publications:

(1) U.S. Application Ser. No. 20,729, Foerster et al; claiming priority of German Application No. P 28 13 206 of Mar. 25, 1978; Attorney Docket No. FF 78585, Rl. Nr. 1849/78 filed simultaneously herewith.

(2) DBP 1 512 112 U.S. Pat. No. 3,428,745

(3) DBP 1 944 378 U.S. Pat. No. 3,715,462

The present invention relates to playback systems and, more particularly, to playback systems wherein frequency modulated signals are recorded on a record carrier, such as a tape, which is scanned, at least from time to time, at a playback speed which differs from the speed at which the signals were recorded.

BACKGROUND AND PRIOR ART

During playback of frequency modulated signals, the situation occurs from time to time that the playback speed, namely the relative speed between the record carrier and the scanning element differs from the speed at which the frequency modulated signals were recorded. To compensate for these errors, a system is known (U.S. Pat. No. 3,428,745) in which an electronically variable delay line is controlled by an error signal in such a way that timing errors resulting from the differences between the recording speed and the playback speed are automatically corrected.

However, during playback of frequency modulated signals such speed differences result in a frequency shift which, after demodulation, results in an amplitude error.

THE INVENTION

It is an object of the present invention to compensate for the above-mentioned amplitude errors. Since such a frequency shift during playback of a frequency modulated signal also occurs during purposely introduced differences between the playback speed and the recording speed such as is the case for example for slow motion, time lapse or stop motion playback, the present invention is particularly advantageous for use in television tape recording devices.

The present invention comprises means for measuring the frequency deviation resulting from the above-described speed differences in the output signals furnished by the means which scan the record carrier (e.g. the readout head of the tape recorder). The gain of a variable gain amplifier which amplifies the output signal is varied in accordance with the frequency deviation signal and in a direction compensating for changes in amplitude of the output signals resulting from the undesired frequency deviation.

DRAWING ILLUSTRATING A PREFERRED EMBODIMENT

FIG. 1 is a schematic block diagram of a playback system according to the present invention; and, FIG. 2 is a voltage-time diagram of signals at various points in the system shown in FIG. 1.

In FIG. 1, a tape recorder is denoted by reference numeral 1. The tape recorder records color television signals. The tape 2 is transported past a head 3. To simplify the diagram only one playback head is shown. However the invention can be applied readily to tape recorders having two or more playback heads. For the same reason, the representation of rotating heads which are usual for television tape recorders is dispensed with. The output signals of head 3 are amplified in a preamplifier 4, pass through a filter 5 having a controllable frequency characteristic and are applied to a demodulator 6. If tape recorder 1 has a plurality of heads 3, a selector switch 7 would be provided for connecting filters 5 associated with each of the heads in a predetermined order to the input of demodulator 6.

The output of demodulator 6 is applied to the input of the measuring circuit which measures the frequency deviation. This includes a delay 8 interconnected between the output of demodulator 6 and the input of a variable gain amplifier 9. Also connected to the output of demodulator 6 is a gate 10 whose output is connected to a phase comparator 12. A second input of phase comparator 12 is connected to the output of a gate 11 whose input is connected through a further delay 15 to the output of delay 8. The output of phase comparator 12 is connected to a sample-and-hold circuit 13. The output of sample-and-hold circuit 13 is connected to the inverting input of a difference amplifier 14. A reference voltage $U_o$ is connected to the direct input of difference amplifier 14, while its output is connected to the control input of variable gain amplifier 9. The output of variable gain amplifier 9 is connected to the input of an ammplitude measuring stage 16 whose output is connected to the control input of filter 5. The output of variable gain amplifier 9 is further connected to a time error compensating circuit 17. One control input of time correcting circuit 17 is connected to the output of a sawtooth generator 18 whose input is connected to the output of sample-and-hold circuit 13.

Operation:

The operation of the frequency measuring circuit will be described as measuring the time period of one line of the color television signal. However it is equally possible to carry out the measurement on the basis of the period of a pilot carrier also recorded on tape 2.

The measurement of the time required for one line of the color television signal is carried out by means of a phase comparison of the color burst of one line with that of the next following line, the color bursts constituting periodically recurring portions of the demodulated television signal. The delay introduced by delay unit 8 is a time corresponding to one horizontal line of the color television signal at the recording speed. The color burst is separated from the demodulated television signal by gate 10 (a burst separator in itself well known in the art) and, following delay 8 by a similar gate 11.

The so-separated color bursts are applied to respective inputs of phase comparator 12. Since for color television systems with quadrature modultion of the chrominance subcarrier the frequency of the latter is not an integral multiple of the line frequency, a further delay 15 is provided which is adjusted to a percentage of the chrominance subcarrier oscillation in accordance with the particular television system being used. In PAL systems in which the phase of the chrominance subcarrier alternates for sequential lines, delay 15 can be switched to the required value on a line-by-line basis.

Referring now to FIG. 2, line a shows the color bursts appearing at the output of gate 10, while line b shows the color burst appearing at the output of gate 11. The solid line in line a indicates the desired time period, that is the time for a single line if the recording and playback speeds are the same. The dashed line indicates a shorter time period. If it is assumed that the output voltage of phase comparator 12 is zero when the two applied signals are in phase and is positive when the signal from gate 10 leads the signal from gate 11, then the phase comparator output voltage will be as shown in line c of FIG. 2. Between sequential color bursts, the signal applied at the two inputs of phase comparator 12 are zero. The output voltage of the phase comparator is therefore also zero. When the color burst in line a leads that in line b, a positive output voltage, as indicated by the dashed lines, will result. The pulses shown in line d are the sampling pulses which cause the amplitude of the output voltage of phase comparator 12 to be sampled by sample-and-hold circuit 13 and maintained therein until the next following sampling pulse. Specifically, the sampling takes place during the time that the color bursts are applied to the two inputs of phase comparator 12 and the so-sampled value is then maintained throughout the next line. The sample-and-hold circuit is in itself well known and mainly comprises a switch and a storage such as, for example, a capacitor, the switch being activated by the line frequency pulses H during at least part of the time at which the color bursts are being applied so that the capacitor is charged to the output voltage of phase comparator 12. The frequency deviation signal appearing at the output of sample-and-hold circuit 13 takes the shape shown in line e of FIG. 2. Up to time $t_2$ the voltage is zero and following time $t_2$ the solid line indicates the zero value when the signal in line a is the solid line signal and will have the value indicated by dashed lines when the color burst in line a is that indicated by the dashed lines.

The output signal of sample-and-hold circuit 13 is thus a measure of whether the frequency of the played back signals is too high or too low. Since frequency deviations cause deviations in the amplitude of the signals at the output of demodulator 6, the output voltage of sample-and-hold circuit 13 is also a measure for these undesired amplitude changes. It is therefore applied to the inverting input of difference amplifier 14 whose output controls the gain of variable gain amplifier 9. The reference voltage $U_o$ applied to the direct input of difference amplifier 14 is the voltage which will cause the gain of amplifier 9 to be unity, that is amplifier 9 will not have any influence on the amplitude of the video signals. If the speed of the magnetic tape increases, the amplitude of the video signals will become too large, while at the same time sample-and-hold circuit circuit 13 furnishes a positive voltage which is subtracted from voltage $U_o$. The amplitude of the video signals is then decreased by amplifier 9, that is amplifier 9 serves as an attenuator. If the playback speed decreases, the amplitude of the video signals decreases and, at the same time a negative voltage appears at the output of sample-and-hold circuit 13 which is added to voltage $U_o$ by difference amplifier 14 and increases the gain of amplifier 9.

For a system with a multiplicity of heads 3, the following should be noted:

Switch 7 is operated only during the horizontal flyback time between two groups of lines in order to prevent distrubances which would otherwise occur. When sitch 7 is operated, the two bursts compared in the phase measuring circuitry would belong to two different groups of lines so that the phase comparator output would not be related to changes in the playback speed. To prevent utilizaion of this erroneous phase comparator output, sample-and-hold circuit 13 is not operated during switching of switch 7. The last value derived within a group of lines is retained in sample-and-hold circuit 13 during the next following line thereby allowing at least an approximate correction.

The output signals from heads 3 also have amplitude variations resulting from differences in the head-type contact. These amplitude variations are corrected in part by the fact that frequency modulation is used. It has, however, been found advantageous to use a frequency compensating filter 5 in front of demodulator 6. Filter 5 has a controllable frequency characteristic at the higher frequencies of the recorded signals. A circuit 16 is provided which measures the amplitude of, for example, the color burst or of a reference pilot signal and adjusts the variable or controllable frequency characteristic of filter 5 accordingly. A circuit such as circuit 16 is well known in the art and is described in, for example, U.S. Pat. No. 3,715,462 (Krause). Circuit 16 includes a gate circuit which is conductive only for the duration of the color burst. After passing through the gate circuit, the color burst is applied to a rectifier device which furnishes a D.C. voltage which is proportional to the amplitude of the color burst. A difference amplifier is then used to compare the amplitude of this D.C. voltage to the desired value of the amplitude of the color burst. A control voltage corresponding to the deviation of the amplitude of the color burst from the desired value is then available at the output of the difference amplifier. The control voltage is then used to adjust the frequency characteristic of filter 5 as mentioned above. In known circuits, the amplitide measured by circuit 16 will also vary as a function of the difference between the recording and playback speeds. This amplitude error is then reflected in an error in the frequency characteristic of filter 5. To avoid this error, circuit 16 is connected to the output of variable gain amplifier 9. It will be remembered that the signals at the output of variable gain amplifier 9 have already been compensated for the above-mentioned differences between the playback and recording speeds.

A time error compensating circuit 17 is connected following variable gain amplifier 9. Circuit 17 contains controllable storage or delay elements. The control of the delay time or storage time of these elements is carried out in known fashion principally by phase comparisons between synchronizing pulses and color bursts derived from the signals recorded on the tape and corresponding reference pulses. Circuit 17 also receives a sawtooth voltage which is generated in sawtooth generator 18 and whose amplitude is proportional to the output voltage of sample-and-hold circuit 13. The signals furnished at output terminal 19 of circuit 17 are therefore corrected both with respect to timing errors and amplitude errors.

Various changes and modifications may be made within the scope of the inventive concepts.

I claim:

1. In a playback system having record carrier means having frequency modulated signals recorded thereon at a recording speed, and scanning means for scanning said record carrier means at a playback speed and furnishing output signals corresponding to said frequency modulated signals, a system for correcting said output signals for undesired changes resulting from differences between said playback speed and said recording speed, comprising means (8, 10, 11, 12, 13) for measuring frequency deviations in said output signals resulting from said differences in said recording and playback speeds and furnishing a frequency deviation signal corresponding to the so-measured deviation;

variable gain amplifier means (9) connected to said scanning means for amplifying said output signals; and means (14) interconnected between said measuring means and said variable gain amplifier means for changing the gain of said variable amplifier means in response to said frequency deviation signal and in a direction opposing said undesired changes.

2. A system as set forth in claim 1, further comprising filter means (5) having a controllable frequency characteristic connected to said scanning means for filtering said output signals, and means (16) interconnected between said variable gain amplifier means and said filter means for controlling said frequency characteristic of said filter means in dependence on said amplified output signals.

3. A system as set forth in claim 1, wherein said output signals have portions recurring at predetermined time intervals when said playback speed is equal to said recording speed;

and wherein said measuring means furnishes a frequency deviation signal corresponding to the difference between the actual time interval between said portions and said predetermined time interval.

* * * * *